(12) United States Patent
Zhou (10) Patent No.: US 11,430,765 B2
(45) Date of Patent: *Aug. 30, 2022

(54) SEMICONDUCTOR SENSOR PACKAGE (71) Applicant: STMICROELECTRONICS PTE LTD, Singapore (SG)

(72) Inventor: Jian Zhou, Shenzhen (CN)

(73) Assignee: STMICROELECTRONICS PTE LTD, Singapore (SG)

( * ) Notice: Subject to any disclaimer, the term of this patent is extended or adjusted under 35 U.S.C. 154(b) by 113 days.

This patent is subject to a terminal disclaimer.

(21) Appl. No.: 16/795,099

(22) Filed: Feb. 19, 2020

(65) Prior Publication Data

US 2020/0185356 A1 Jun. 11, 2020

Related U.S. Application Data (60) Continuation of application No. 16/189,010, filed on Nov. 13, 2018, now Pat. No. 10,600,758, which is a
(Continued)

(30) Foreign Application Priority Data

Dec. 30, 2016 (CN) .......................... 201611265163.8

(51) Int. Cl.
*H01L 25/065* (2006.01)
*H01L 25/00* (2006.01)
(Continued)

(52) U.S. Cl.
CPC .......... *H01L 25/0655* (2013.01); *H01L 21/50* (2013.01); *H01L 23/10* (2013.01); *H01L 23/3121* (2013.01); *H01L 25/50* (2013.01)

(58) Field of Classification Search
CPC ..... H01L 25/0655; H01L 23/10; H01L 21/50; H01L 25/50; H01L 23/3121;
(Continued)

(56) References Cited

U.S. PATENT DOCUMENTS 6,495,914 B1* 12/2002 Sekine ................ H01L 23/5389
257/723
7,332,375 B1* 2/2008 Glenn ............... H01L 23/49541
257/E21.502
(Continued)

FOREIGN PATENT DOCUMENTS

CN 101437187 A 5/2009
CN 102709275 A 10/2012
(Continued)

*Primary Examiner* — Mohammed R Alam
(74) *Attorney, Agent, or Firm* — Seed IP Law Group LLP (57) ABSTRACT

A package packaged with a cap. The package features trenches, through holes, and a non-conductive coupling element forming a locking mechanism integrated embedded or integrated within a substrate. The package has a cap coupled to the non-conductive coupling element through ultrasonic plastic welding. The package protects the dice from an outside environment or external stresses or both. A method is desired to form package to reduce glue overflow defects in the package. Fabrication of the package comprises drilling holes in a substrate; forming trenches in the substrate; forming a non-conductive coupling element in the through holes and the trenches to form a locking mechanism; allowing the non-conductive coupling element to harden and cure; coupling a die or dice to the substrate; and coupling a cap to the non-conductive coupling element to protect the die or dice from an outside environment or external stresses or both.

20 Claims, 10 Drawing Sheets

Related U.S. Application Data division of application No. 15/406,589, filed on Jan. 13, 2017, now Pat. No. 10,181,453.

(51) Int. Cl.
*H01L 23/31* (2006.01)
*H01L 23/10* (2006.01)
*H01L 21/50* (2006.01)

(58) Field of Classification Search
CPC . H01L 2224/32225; H01L 2224/48227; H01L 2924/16151; H01L 2924/16153; H01L 2924/16251; H01L 21/52
See application file for complete search history.

(56) References Cited

U.S. PATENT DOCUMENTS

| | | |
|---|---|---|
| 2004/0124505 A1 | 7/2004 | Mahle et al. |
| 2009/0219698 A1 | 9/2009 | Chao |
| 2011/0089529 A1 | 4/2011 | Fowlkes et al. |
| 2014/0254851 A1 | 9/2014 | Chen |

FOREIGN PATENT DOCUMENTS

| | | |
|---|---|---|
| CN | 103258828 A | 8/2013 |
| JP | 2007-174635 A | 7/2007 |

\* cited by examiner

SEMICONDUCTOR SENSOR PACKAGE

BACKGROUND

Technical Field

The present disclosure is directed to a package having a substrate and a cap coupled to the substrate with coupling features formed in the substrate.

Description of the Related Art

Packages often include a semiconductor die and a substrate that provides an interface between contacts on the substrate and the semiconductor die. The package can include encapsulant to secure elements of the package into a single discrete unit. Alternatively, packages may include a cap on the substrate enclosing the die in a chamber. The cap is coupled to the substrate by glue. The glue is usually applied to the substrate, and the cap is then placed on the glue. The glue is then allowed to harden and cure, coupling the cap to the substrate and protecting the die from an outside environment or external stresses or both.

Unfortunately, as a cap is placed on the glue that has been applied to the substrate to attach the cap, the substrate and the die become susceptible to glue overflow. The overflow of the glue can cover essential components on the substrate or the die necessary for the package to work at full capacity, such as covering a contact pad. The fragility of the packages greatly increases the difficulty of handling the packages during the manufacturing process. Not using glue increases the overall percentage of viable packages and semiconductor sensors from each manufacturing batch.

BRIEF SUMMARY

The present disclosure is directed to various packages that can be formed without glue by utilizing injection molding, compression molding, ultrasonic-plastic plastic welding, or any combination of formation techniques known to the semiconductor industry. These various embodiments of a package can measure various quantities such as pressure, temperature, speed, vibration, or any other quantity required. For example, the substrate can be drilled with through holes and etched with trenches to form channels for non-conductive coupling elements, the substrate may be formed having through holes and trenches to form channels for non-conductive coupling elements, or through holes and trenches may be formed in the substrate to form channels for non-conductive coupling elements or a non-conductive material. Non-conductive coupling elements may be a plastic, a polymer, a dielectric material, or any other insulating material that can be injected or compressed into the channels formed by the through holes and the trenches. The non-conductive coupling elements are then cured to form a locking mechanism within the substrate. At which point, a cap can be ultrasonic-plastic welded to the non-conductive coupling elements embedded, integrated, or located in the substrate to form an enclosed chamber to protect a die or dice coupled to the substrate.

According to one embodiment, the semiconductor package is constructed having a substrate, non-conductive coupling elements, and a cap. The substrate has a first surface, a second surface, a plurality of through holes, a plurality of first trenches, a plurality of second trenches, and a support region or a plurality of support regions. The through holes of the plurality of through holes pass through the substrate from the first surface to the second surface. The plurality of first trenches and the plurality of second trenches are formed in the first surface of the substrate. The first trenches of the plurality of first trenches are substantially parallel to each other and aligned with through holes of the plurality of through holes. The second trenches of the plurality of second trenches are transverse to the first trenches of the plurality of first trenches. The second trenches of the plurality of second trenches may overlap at least one of the through holes aligning the first trenches.

The non-conductive coupling elements have first portions having top surfaces that are substantially coplanar with the first surface of the substrate and extend into the substrate. Furthermore, the non-conductive coupling elements have a plurality of second portions that extend from the first portion through the substrate to the second surface of the substrate. The non-conductive coupling elements are formed or placed into the plurality of through holes, the plurality of first trenches, and the plurality of second trenches. The cap may have one chamber, two chambers, or any number of chambers and walls to protect any number of semiconductor dice or electronic devices from an outside environment, external stresses or both.

Furthermore, in an alternative embodiment the substrate has a first surface, a second surface, a plurality of first trenches, a plurality of second trenches, a plurality of through holes, a plurality of third trenches, a plurality of fourth trenches and a support region or a plurality of support regions. The through holes of the plurality of through holes pass through the substrate from the first surface to the second surface.

The plurality of first trenches and the plurality of second trenches are formed in the first surface of the substrate. The first trenches of the plurality of first trenches are substantially parallel to each other and are aligned with through holes of the plurality of through holes. The second trenches of the plurality of second trenches are transverse to the first trenches of the plurality of first trenches. The second trenches of the plurality of second trenches may overlap at least one of the through holes aligning the first trenches. The plurality of third trenches and the plurality of fourth trenches are formed in the second surface of the substrate. Each third trench of the plurality of third trenches is substantially parallel to the other third trenches, aligned with through holes of the plurality of through holes, and opposite to a respective first trench of the plurality of first trenches. Each fourth trench of the plurality of fourth trenches is transverse to the plurality of third trenches and opposite to a respective second trench of the plurality of second trenches. The fourth trenches of the plurality of fourth trenches may overlap at least one of the through holes aligning the third trenches.

The non-conductive coupling elements have first portions having top surfaces that are substantially coplanar with the first surface of the substrate and extend into the substrate. Additionally, the non-conductive coupling elements have third portions having bottom surfaces that are substantially coplanar with the second surface of the substrate and extend into the substrate. Furthermore, the non-conductive coupling elements have second portions that extend from the first portion of the non-conductive coupling elements through the substrate to the third portion of the non-conductive coupling elements. The non-conductive coupling elements are formed in, located in or fit into the plurality of through holes, the plurality of first trenches, the plurality of second trenches, the plurality of third trenches, and the plurality of fourth trenches. The cap may have one chamber, two chambers, or any number of chambers and walls to protect any number of semiconductor dice or electronic devices from an outside environment, external stresses, or both.

Finally, according to one embodiment, the semiconductor package is constructed having a substrate with a plurality of through holes and pluralities of trenches. A plurality of first trenches on the substrate is aligned with a number of through holes of the plurality of through holes, and the first trenches of the plurality of first trenches are substantially parallel with each other. A plurality of second trenches on the first surface of the substrate is formed. The second trenches of the plurality of second trenches are formed to be transverse to the first trenches of the plurality of first trenches. Two of the first trenches of the plurality of first trenches and two of the second trenches of the plurality of second trenches form a border that surrounds a support region on the substrate. A non-conductive material is formed in the through holes and trenches of the substrate to form a locking mechanism embedded or integrated within the substrate. The support region of the substrate is surrounded by the non-conductive material. A semiconductor die, dice, or electronic device(s) are attached and coupled to the support region of the substrate. A cap is then welded to the locking mechanism of the non-conductive material in the substrate to enclose and surround the semiconductor die, dice, or electronic device(s). The cap protects the die, dice, or electronic device(s) from an outside environment, external stresses or both. By welding the cap to the locking mechanism, glue is no longer needed to attach the cap to the substrate of the semiconductor sensor package and defects from glue overflow are avoided.

BRIEF DESCRIPTION OF THE SEVERAL VIEWS OF THE DRAWINGS

In the drawings, identical reference numbers identify similar elements or acts unless the context indicates otherwise. The sizes and relative positions of elements in the drawings are not necessarily drawn to scale.

DETAILED DESCRIPTION

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Figure 1:
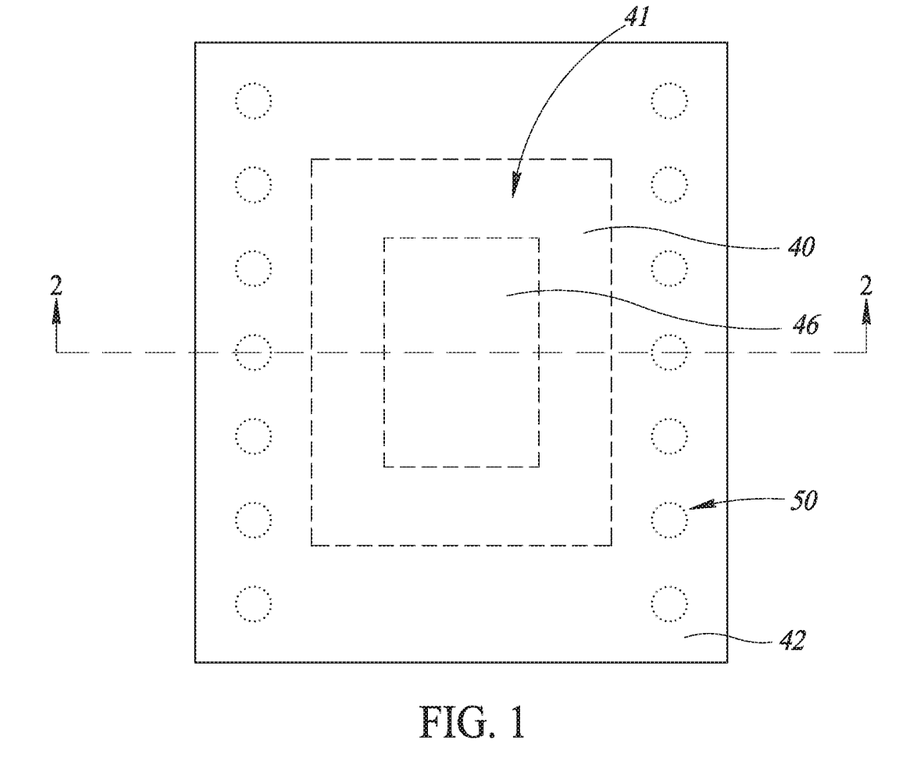
FIG. 1 is a top plan view of an embodiment of a semiconductor package.
Figure 2:
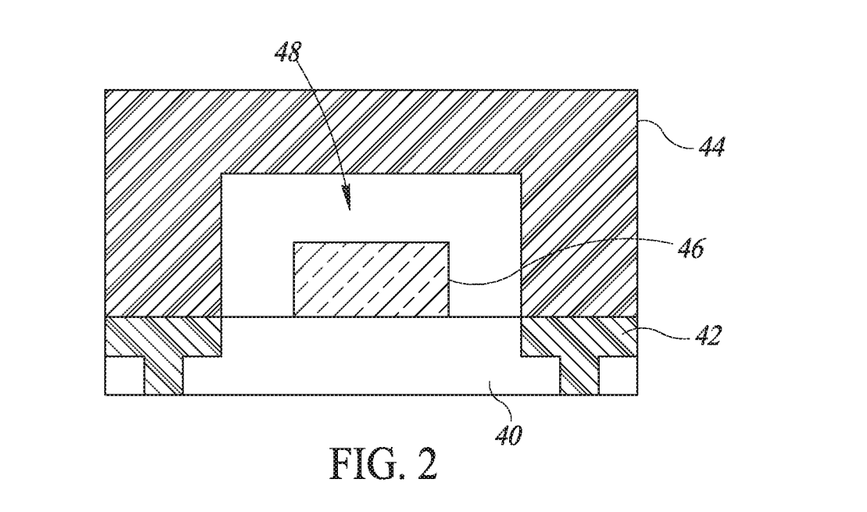
FIG. 2 is a cross-sectional view taken along line 2-2 of the package of FIG. 1.

FIGS. 1 and 2 are directed to one embodiment of a package 38 including a substrate 40, a non-conductive coupling element 42, a cap 44, a die 46 and a chamber 48. The die 46 may be any semiconductor sensor to measure any quantity required.

In this embodiment, the substrate 40 is positioned at the bottom of the package 38 as a base layer during fabrication. The substrate 40 has a die 46 coupled to a first surface of the substrate 40. The die 46 is electrically and physically coupled to the substrate 40 at a support region 41. The support region 41 may be of any shape or size. The substrate 40 contains electric connections and components for the die 46 to be electrically connected to circuits outside the package 38. These electric connections or components may be formed through the well-known techniques of a conductive die attach film, conductive wires, bonding wires, conductive pads, combinations thereof, or any other technique known to the semiconductor industry. The substrate 40 also has a non-conductive coupling element 42 such as a plastic, a polymer, a dielectric material, or any other insulating or non-conductive material formed in holes and trenches of the substrate 40. The non-conductive coupling element 42 is formed in the substrate 40 and is allowed to harden and cure within the substrate 40 before coupling the cap 44 to the package. The non-conductive coupling element 42 surrounds the support region 41. The non-conductive coupling element 42 in the substrate 40 allows for the cap 44 to be directly coupled to the non-conductive coupling element 42, avoiding the use of glue to couple the cap 44 to the substrate 40 to form the package. The cap 44 may be coupled to the non-conductive coupling element 42 by ultrasonic-plastic welding, heat treating, or any other attachment or coupling technique known to the semiconductor industry for two polymers without the use of glue. The cap 44 forms a chamber 48 around the die 46 protecting the die 46 from undesired exposure in the outside environment, external stresses or both. Utilizing a non-conductive coupling element 42 that has been formed and cured in the substrate 40 to attach a cap 44 allows for the manufacturer to avoid the use of glue. In turn, avoiding any possible glue overflow onto the electric connections and components exposed on the substrate 40 or the die 46.

Figure 3:
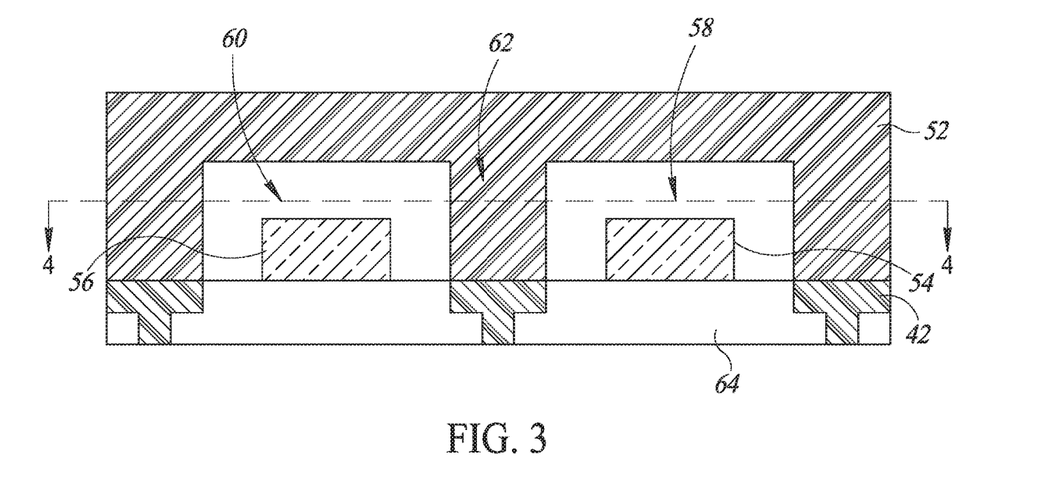
FIG. 3 is a cross-sectional view of an alternative embodiment of a semiconductor package taken along line 3-3 of the package in FIG. 4.
Figure 4:
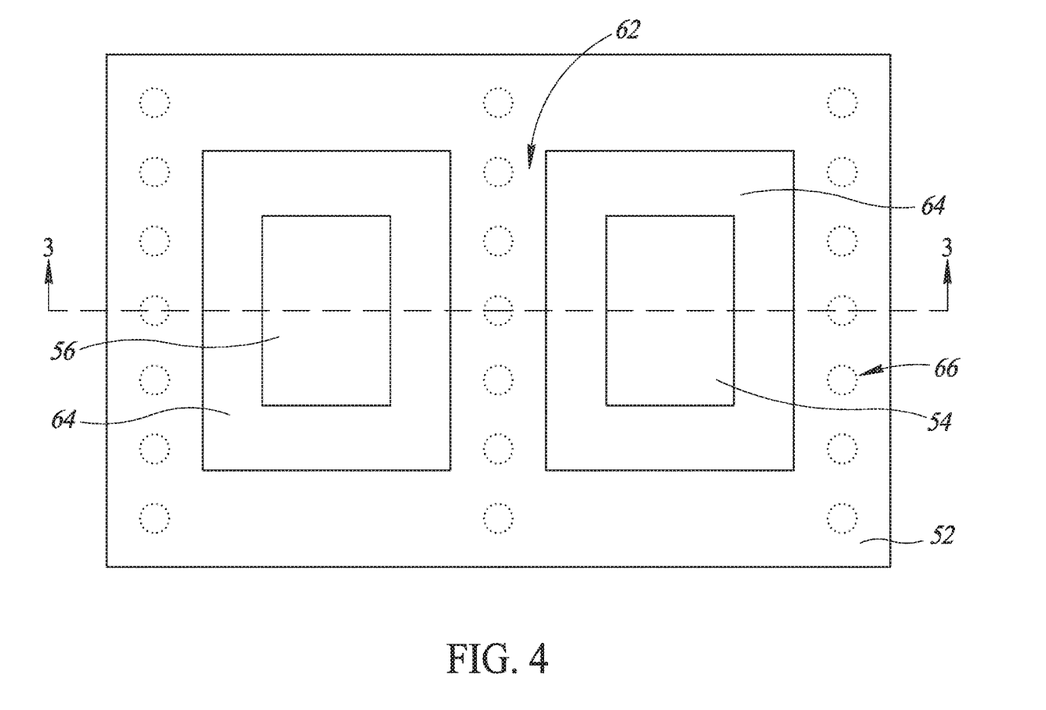
FIG. 4 is a top plan view taken along line 4-4 of the alternative embodiment of the semiconductor package of FIG. 3.

FIGS. 3 and 4 are directed to an alternative embodiment of a package 59 including a substrate 64, a non-conductive coupling element 42, a cap 52 having a wall 62, two die 54, 56, and two chambers 58, 60. The two die 54, 56 may be any semiconductor sensors to measure any quantity required.

In this embodiment, the substrate 64 is positioned at the bottom of the package 59 as a base layer during fabrication. The substrate 64 has two dice 54, 56 coupled to a first surface of the substrate 64. The dice 54, 56 are electrically and physically coupled to the substrate 64. The substrate 64 contains electric connections and components required for the dice 54, 56 to be electrically available to an outside environment. As in the other embodiments, these electric connections and components may be formed through a conductive die attach film, conductive wires, conductive pads, or any other technique known to the semiconductor industry. The substrate 64 also has a non-conductive coupling element 42 such as a plastic, a polymer, a dielectric material, or any other insulating material formed in the holes and trenches of the substrate 64. The non-conductive coupling element 42 has been allowed to harden and cure within the substrate 64 before coupling the cap 52 to the package. The non-conductive coupling element 42 in the substrate allows for the cap 52 to be directly coupled to the non-conductive coupling element 42, avoiding the use of glue to couple the cap 52 to the substrate 64. The cap 52 may be coupled to the non-conductive coupling element 42 by ultrasonic plastic welding or any other technique known to the semiconductor industry. The cap 52 forms one chamber 58, 60 around each of the two die 54, 56 protecting the dice 54, 56 from an outside environment, external stresses or both. Utilizing a non-conductive coupling element 42 that has been formed and cured in the substrate 64 to attach a cap 52 allows for the manufacturer to avoid the use of glue, and avoid any possible glue overflow onto the electric connections and components exposed on the substrate 64 or the dice 54, 56. Additionally, utilizing a non-conductive coupling element 42 that has been formed and cured in the substrate 64 to attach a cap 52, allows for any number of semiconductor dice 54, 56 to be quickly and easily packaged together to manufacture packages that protect either a single semiconductor die, multiple semiconductor dice, a single electronic device, or multiple electronic devices.

Figure 5:
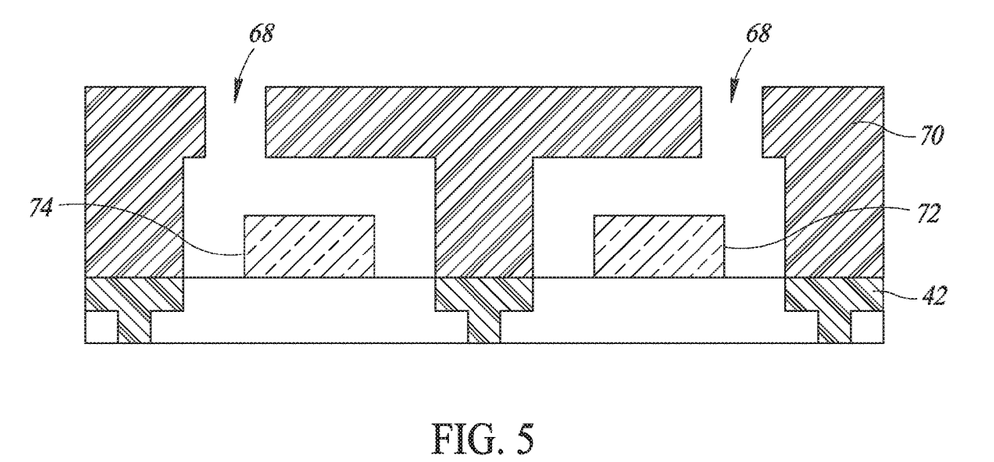
FIG. 5 is a cross-sectional view of an alternative embodiment of a package.

FIG. 5 is directed to a similar alternative embodiment of a package 69 as FIGS. 3 and 4. This alternative embodiment of a package includes a substrate 64, a non-conductive coupling element 42, a cap 70 having a wall and two holes 68, two die 72, 74, and two chambers 58, 60. The two die 72, 74 may be any semiconductor sensors or electronic devices to measure any quantity required.

This alternative embodiment of the package 69 is similar to FIGS. 3 and 4, the only difference being the two holes 68 in the cap 70. The two holes 68 in the cap 70 allow for proximity sensors, gas sensors, and other like semiconductor sensors, dice, or electronic devices that need to be exposed to an outside environment and protected from external stresses. Likewise, any number of embodiments having any number of dice, any number of chambers, and any numbers of holes in the cap are capable of being manufactured as well as any other similar alternative embodiments by utilizing a non-conductive coupling element to attach a cap to a substrate. For example, an alternative embodiment may have three die, three chambers, and a cap having a single hole exposing only one chamber and one die to an outside environment, while the other die remains in a sealed chamber as a reference die. In addition, an alternative embodiment may have a single die, a single chamber, and a cap having a single hole exposing the chamber and the die to an outside environment.

The dice 72 and 74 are, in one embodiment, gas sensors. The apertures 68 expose these die to the outside air. Each die 72 and 74 may sense different gases, such as $CO_2$, CO, $CH_4$, etc. Alternatively one die can be a reference die that is kept sealed in a reference ambient gas, such as argon, nitrogen, or ambient air, with no aperture into its chamber 76 while the other die is exposed to ambient gases via a hole 68 into its chamber 76.

Figure 6:
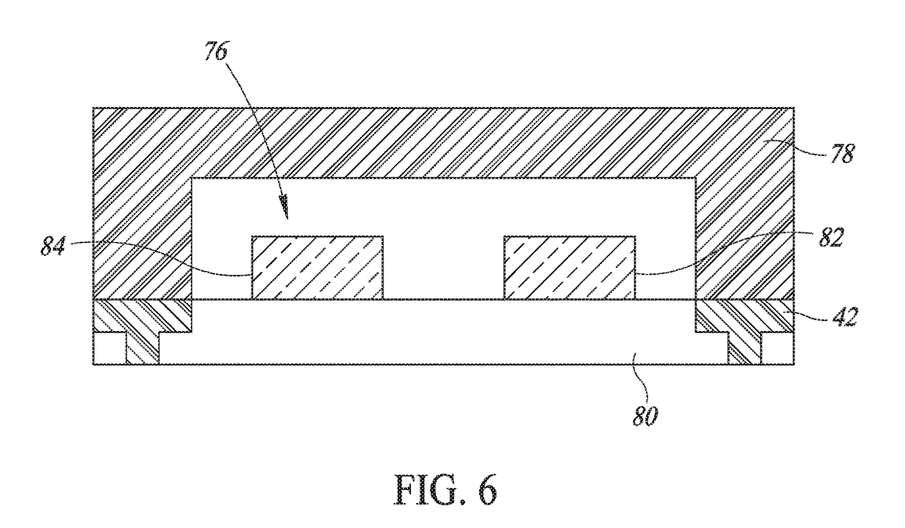
FIG. 6 is a cross-sectional view of an alternative embodiment of a package.
Figure 7:
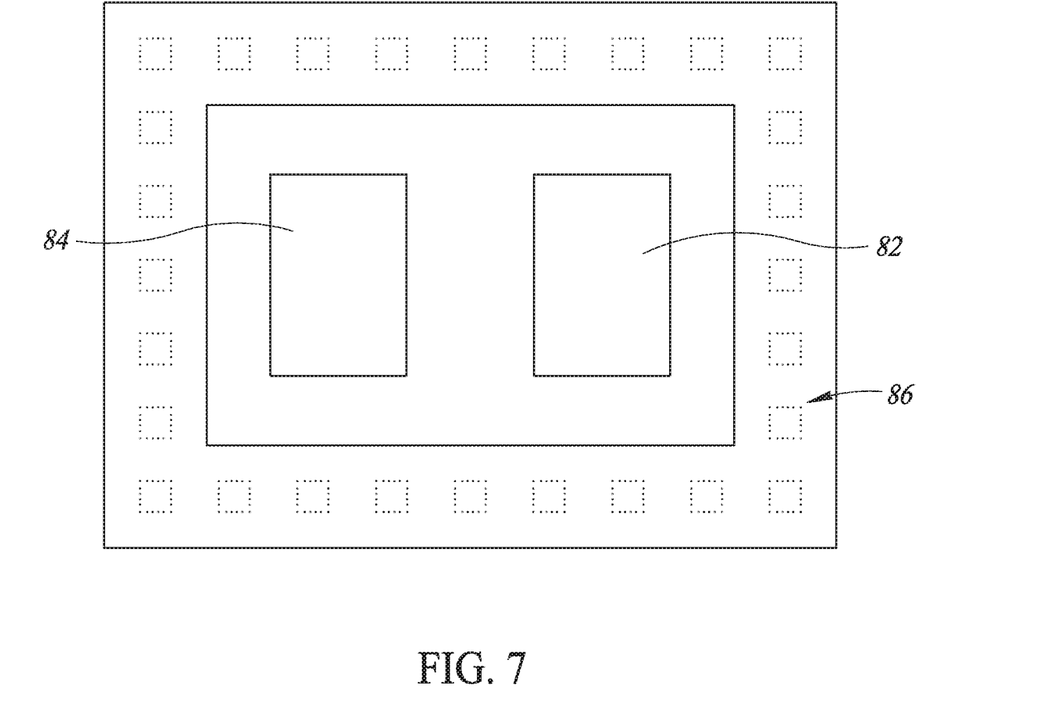
FIG. 7 is a top plan view of the alternative embodiment of the substrate for the semiconductor package of FIG. 6 prior to attaching the cap.

FIGS. 6 and 7 are directed to a similar alternative embodiment of a package as FIG. 1. This alternative embodiment of a package includes a substrate 80, a non-conductive coupling element 42, a cap 78 having no wall, two die 82, 84, and one chamber 76. FIG. 7 shows an alternative embodiment where a plurality of square holes 86 is formed in the substrate 80 instead of circular holes.

This alternative embodiment is of a package that is similar to FIG. 1, the differences being the two dice 82, 84 in one chamber 76 and square holes 86 instead of circular holes. The two die 82, 84 in the one chamber 76 allow for multi-sensing packages to be made with less material when a cap wall is not necessary to separate each die 82, 84. Likewise, alternative embodiments such as three die, a single chamber, and a cap without a wall are capable of being manufactured as well as other similar alternative embodiments by utilizing a non-conductive coupling element to attach a cap to a substrate. In addition, the holes of the plurality of through holes 86 may have any cross-sectional shape desired. For example, the holes of the plurality of through holes may be squares, octagons, rectangles, circles, or any other cross-sectional shape. Also, in alternative embodiments, the second trenches of the plurality of second trenches may be aligned with through holes as well.

Figure 8:
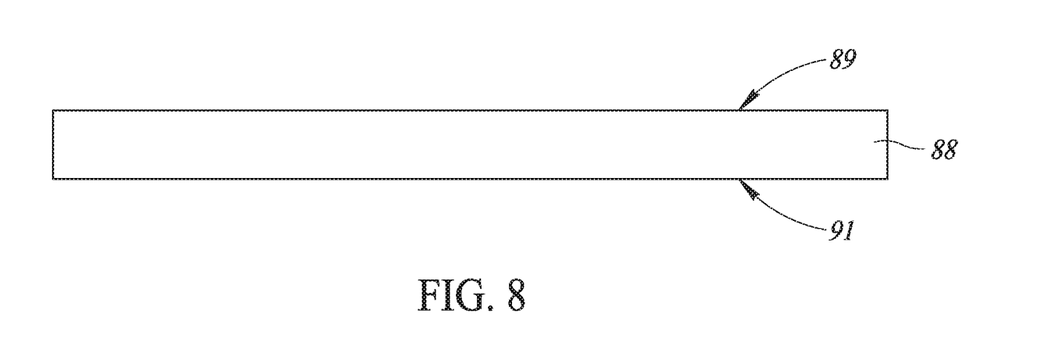
FIGS. 8-18 are cross-sectional and top plan views of an of successive steps of a package fabrication process according to the embodiments disclosed.
Figure 9:
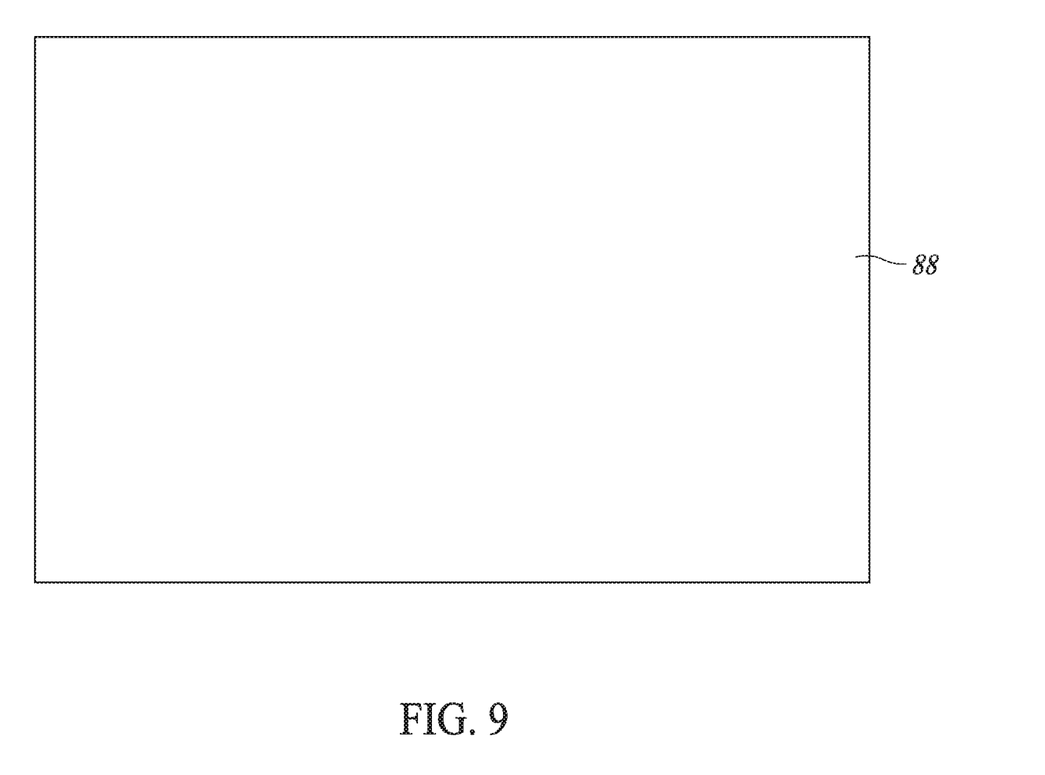

FIGS. 8-19 illustrate the steps in making the package 89. FIG. 8 is a side view of a substrate 88 and FIG. 9 is a top plane view of FIG. 8. The substrate 88 has a first surface 89 and a second surface 91. The substrate 88 may be a printed circuit board (PCB), a wafer, a thin slice of silicon, silicon dioxide, aluminum oxide, or any such substrate material known to the semiconductor industry. The substrate 88 includes electric connections and components needed to form electrical connections that couple electrical components to the substrate 88. These electrical connections and components are not provided in the Figures to avoid confusion.

Figure 10:
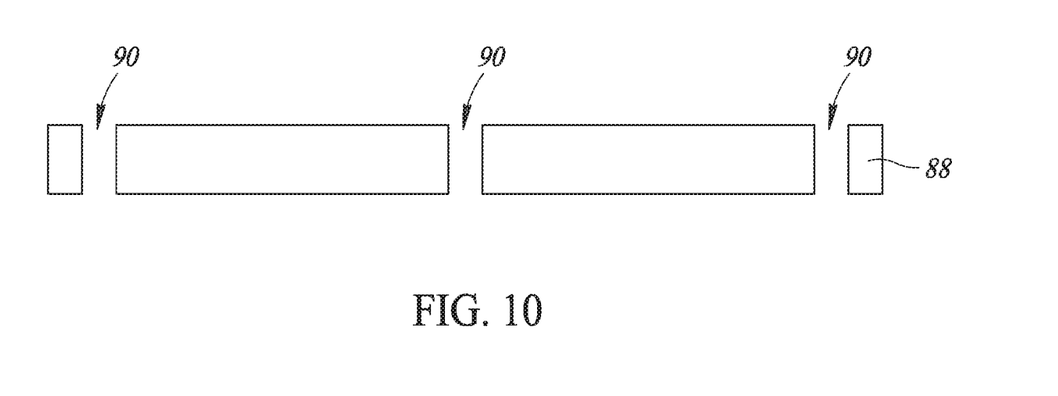
Figure 11:
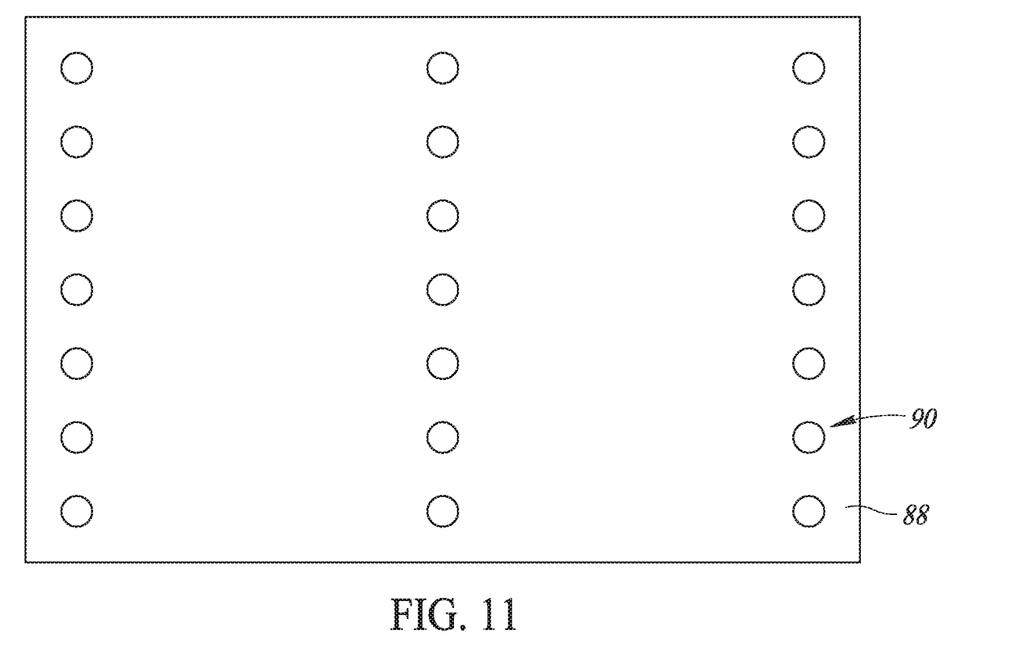

FIG. 10 is a cross sectional side view of a substrate 88 having a plurality of through holes 90 that have been formed through or formed in the substrate 88 from the first surface to the second surface and FIG. 11 is a top plane view of FIG. 10.

In one embodiment, the holes 90 are drilled in the substrate to create a locking mechanism when a non-conductive coupling element 96 (FIG. 15) is placed or formed in through holes 90 and trenches 92, 94. The through holes 90 can be formed by any acceptable technique, for example, etching with a mask, laser cutting, mechanical drilling, punching, or any method of the many known ways to form a hole completely through a substrate.

The through holes 90 formed in the substrate 88 act as a locking mechanism, and the non-conductive coupling element 96 is formed or placed in the holes 90 and trenches 92, 94, which allows for greater structural integrity in the package than if the non-conductive coupling element 96 were merely formed within trenches in the substrate 88 and there were no through holes. In other words, this allows for a cap to be more securely coupled to the package reducing the chances of cap separation from a package when exposed to an outside environment, external stresses or both.

Figure 12:
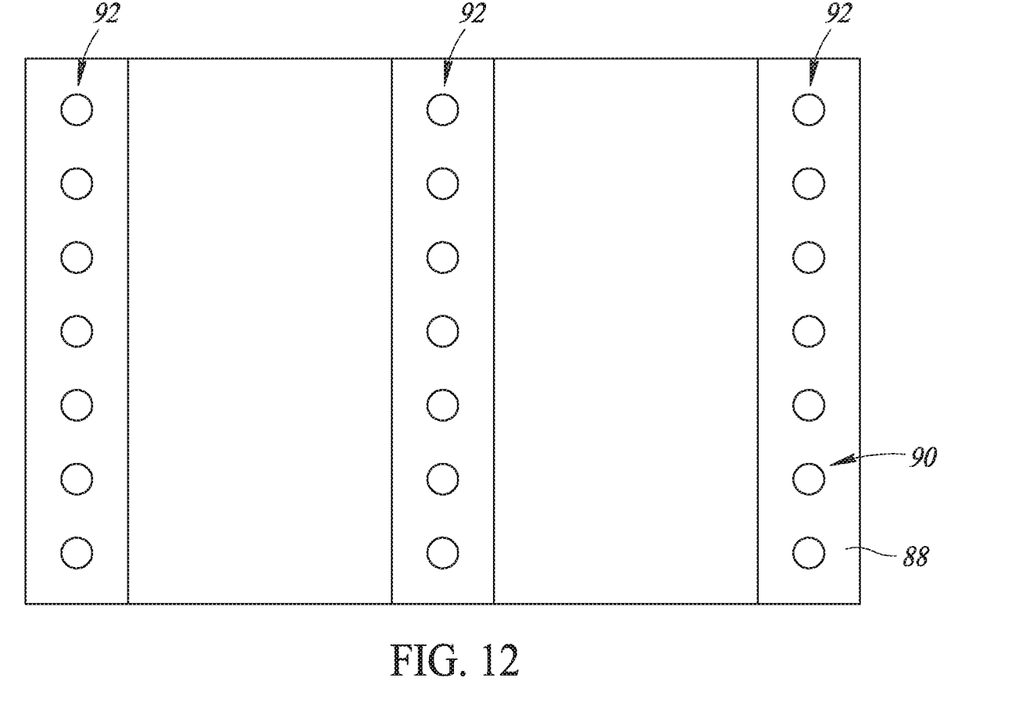
Figure 14:
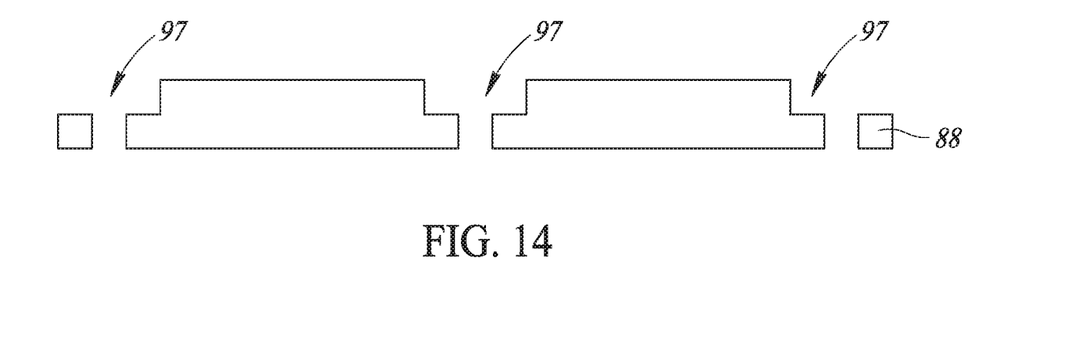
Figure 15:
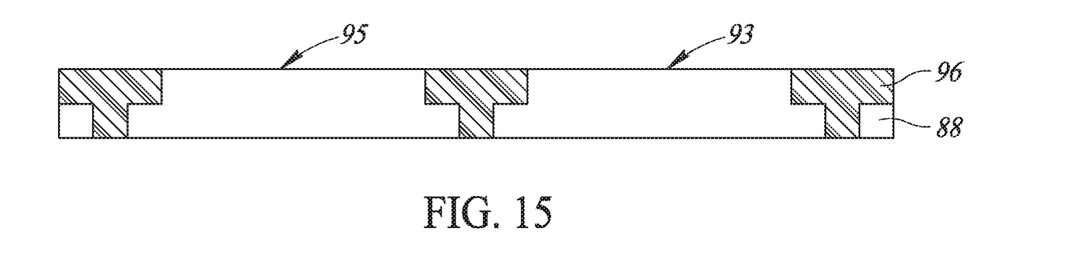
Figure 19:
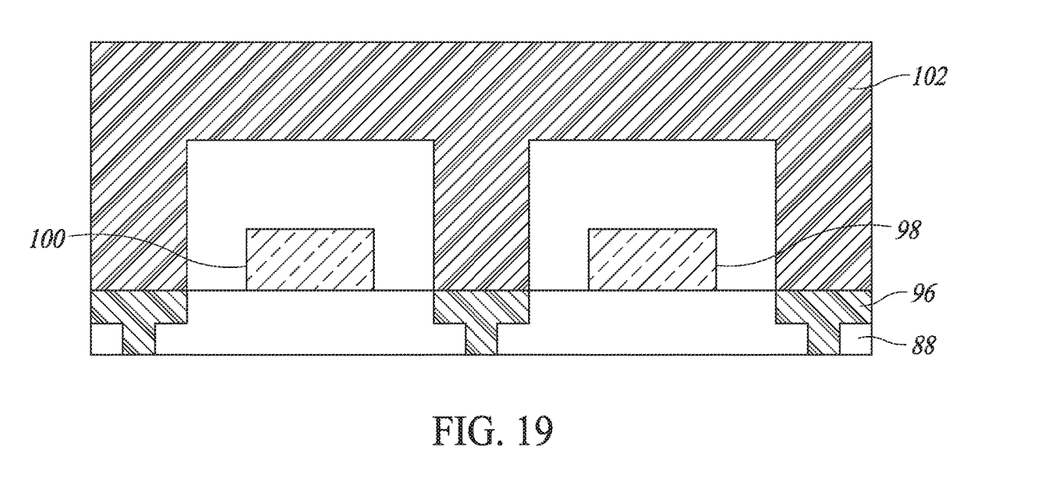
FIG. 19 is a cross-sectional view of a final package made according to the method shown and described for FIGS. 8-18.

FIG. 12 is a top plan view of a plurality of first trenches 92 in a first surface 89 of a substrate 88. The plurality of first trenches 92 is formed above or on top of the plurality of through holes 90. Each first trench of the plurality of first trenches 92 is aligned with a number of the holes of the plurality of through holes 90. Also, each first trench of the plurality of first trenches 92 is substantially parallel to the other first trenches of the plurality of first trenches 92. The plurality of through holes 90 and the plurality of first trenches 92 form a plurality of contiguous T-shaped holes 97 that create a non-conductive coupling element 96 locking mechanism for a cap 102 (FIGS. 14, 15, and 19). These T-shaped holes 97 allow for a cap 102 to be more securely coupled to the package reducing the chances of cap separation from the package when exposed to an outside environment or external stresses or both.

Figure 13:
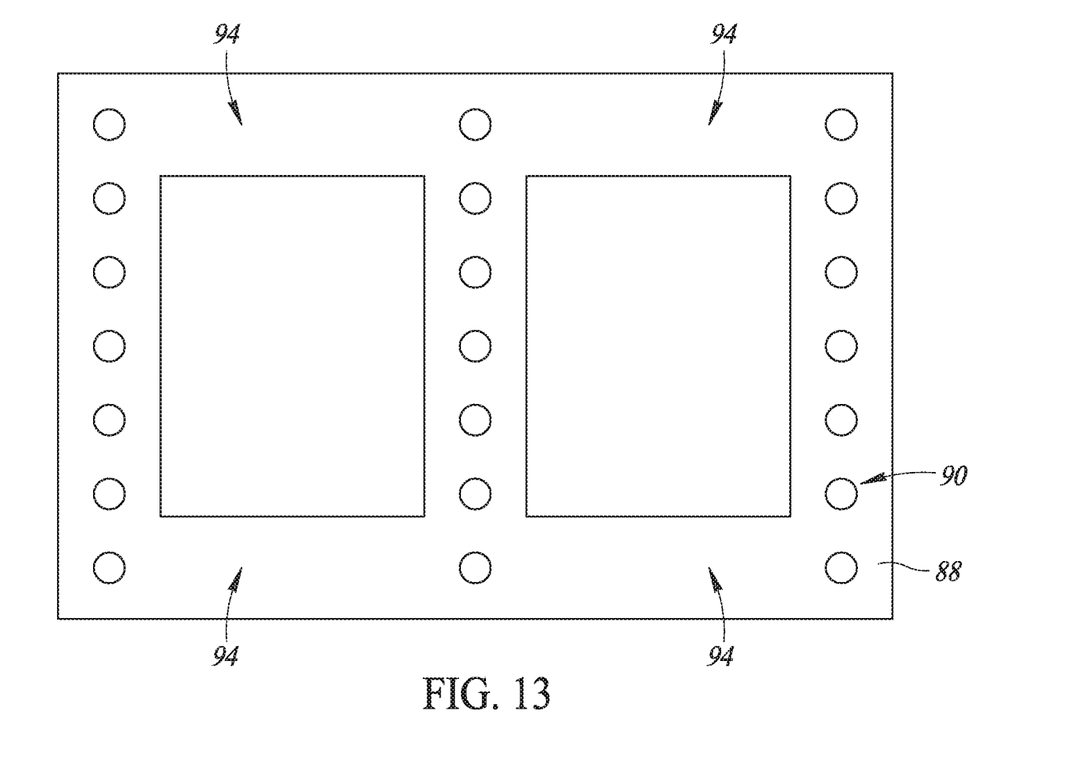

FIG. 13 is a top plan view of a plurality of second trenches 94 formed transverse or substantially perpendicular to the plurality of first trenches 92. The plurality of second trenches 94 are not aligned with a number of holes of the plurality of through holes 90. But each second trench of the plurality of second trenches 94 may overlap at least one through hole of the plurality of through holes 90.

In this embodiment, the plurality of first trenches 92 and the plurality of second trenches 94 are formed to support a cap 102 and allow for the dice 98, 100 to be sealed in separate chambers (FIG. 19). The second trenches of the plurality of second trenches 94 may overlap at least one of the through holes aligning the first trenches 92. The plurality of first trenches 92 and the plurality of second trenches 94 may be formed by milling, etching, or other techniques known to the semiconductor industry. Also, the plurality of first trenches 92 and the plurality of second trenches 94 form a first support region 93 and a second support region 95. The plurality of first trenches 92 and the plurality of second trenches 94 in combination with the plurality of through holes 90 form channels and T-shaped holes 97 that allow for the non-conductive coupling element 96 to be formed throughout the entirety of the substrate 88. The first support region 93 is located between two of the non-conductive coupling elements 96, and the second support region 95 is located between one of the two non-conductive coupling elements 96 around the first support region 93 and another non-conductive coupling element 96. Utilizing trenches 92, 94 on and along the edges of the substrate 88 allow for the cap 102 to be coupled to the substrate 88, for the package to be structurally sound, and for the dice 98, 100 to be sealed off from an outside environment, protected from external stresses or both.

FIG. 14 is a cross-sectional side view of the substrate 88 after the plurality of through holes 90, the plurality of first trenches 92, and the plurality of second trenches 94 have been formed.

FIG. 15 is a cross-sectional side view of the substrate 88 with the plurality of through holes 90, the plurality of first trenches 92, and the plurality of second trenches 94 filled with a non-conductive coupling element 96.

In this embodiment, the non-conductive coupling element 96 is formed in the plurality of through holes 90, the plurality of first trenches 92, and the plurality of second trenches 94 to form an integrated support, a coupling area, and a locking mechanism for the cap 102. The non-conductive coupling element 96 may be placed in the holes and trenches by injection molding it into the trenches and holes 90, 92, 94 from the side, the top, the bottom, or in any other manner. Alternatively, the non-conductive coupling element 96 may be previously and separately formed and then compressed into the trenches and the holes 90, 92, 94 or they can be filled with non-conductive material by any other technique known the semiconductor industry. Also, the non-conductive coupling element 96 may be a plastic, a polymer, a dielectric material, or any other insulating material that can be injected, compressed, or otherwise formed into place using methods known to the semiconductor industry. Once the non-conductive coupling element 96 is formed into place, the non-conductive coupling element 96 is allowed to harden and cure. Utilizing the non-conductive coupling element 96 to couple the cap 102 to the substrate 88 in the package allows for the manufacturer to avoid the use of glue which reduces the chances of overflow onto the substrate 88 or onto the dice 98, 100.

Figure 16:
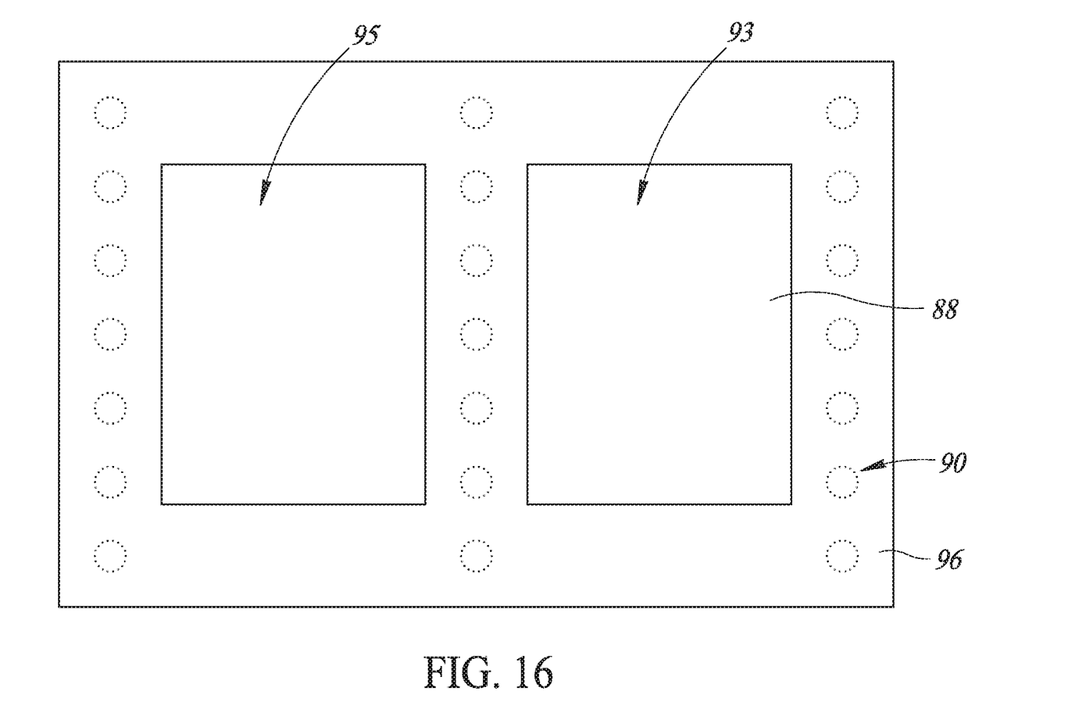

FIG. 16 is a top plan view of the substrate 88 when the plurality of through holes 90, the plurality of first trenches 92, and the plurality of second trenches 94 are filled with a non-conductive coupling element 96 that is then allowed to harden and cure.

Figure 17:
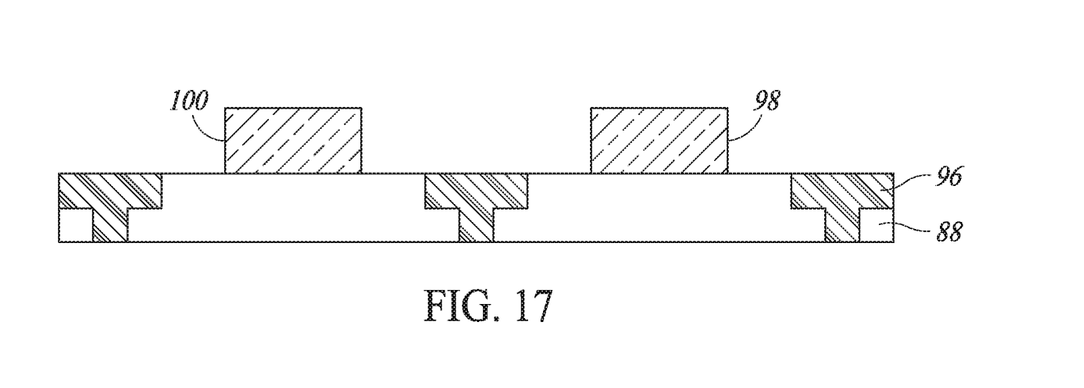

FIG. 17 is a cross-sectional side view of two die 98, 100 coupled to the first surface 89 of the substrate 88. The two die 98, 100 are electrically and physically coupled to the first surface 89 of the substrate 88 such that the dice 98, 100 can be electrically accessed from the outside of the final package. Each die 98, 100 is placed on the first surface 89 of the substrate 88 in either the first or the second support region 93, 95 surrounded or bordered by the non-conductive coupling element 96 in the plurality of through holes 90, the plurality of first trenches 92, and the plurality of second trenches 94.

Figure 18:
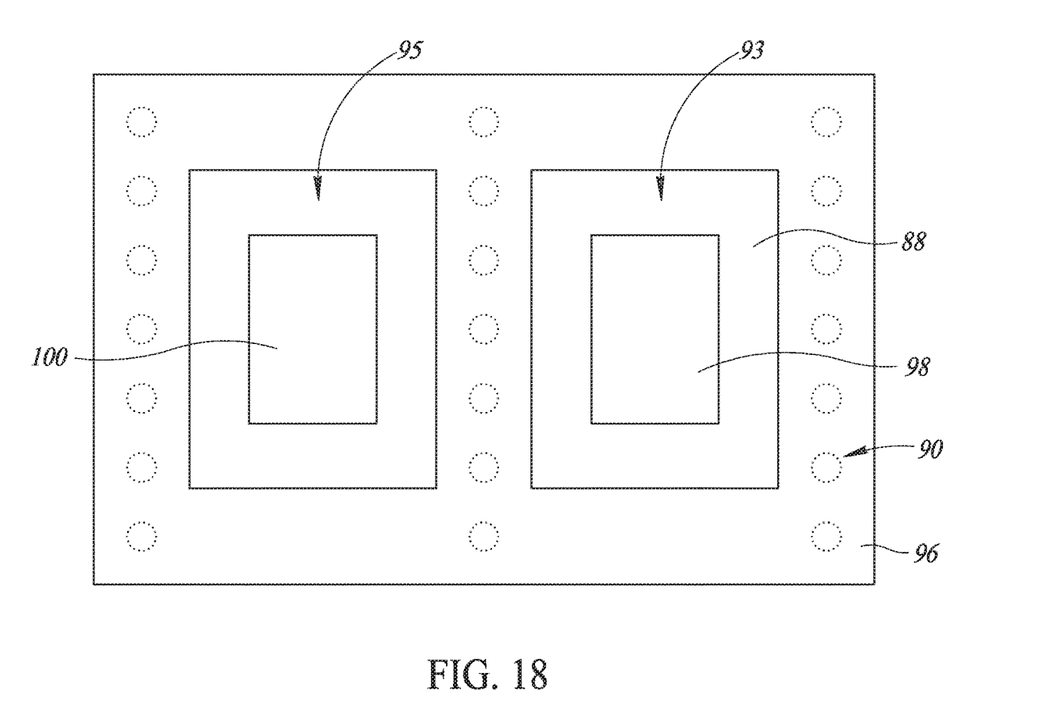

FIG. 18 is a top plan view of the two die 98, 100 coupled to the substrate 88. The two die 98, 100 are electrically and physically coupled to the first surface of the substrate 88 such that the dice 98, 100 can be electrically accessed from the outside of the completed package. Each die 98, 100 is placed on the first surface of the substrate 88 in either the first or the second support region 93, 95 surrounded or bordered by the non-conductive coupling element 96 in the plurality of through holes 90, the plurality of first trenches 92, and the plurality of second trenches 94.

FIG. 19 is a cross-sectional side view of an alternative embodiment of a completed package. A cap 102 with a wall has been coupled to the non-conductive coupling element 96 that has hardened and cured within the substrate 88.

In this embodiment, the completed package 89 has a substrate 88 that is positioned at the bottom of the package as a base layer. The substrate 88 has two die 98, 100 coupled to a first surface of the substrate 88. The dice 98, 100 are electrically coupled to the substrate 88. The substrate 88 contains electric connections and components required for the dice 98, 100 to be electrically accessible to an outside environment. These electrical connections and components may be formed through a conductive die attach film, conductive wires, conductive pads, combinations thereof or any other technique known to the semiconductor industry. The substrate 88 also has a non-conductive coupling element 96 such as a plastic, a polymer, a dielectric material, or any other insulating material formed in the holes 90 and trenches 92, 94 of the substrate 88. The non-conductive coupling element 96 has been allowed to harden and cure within the substrate 88 before coupling the cap 102 to the package. The non-conductive coupling element 96 in the substrate allows for the cap 102 to be directly coupled to the non-conductive coupling element 96, avoiding the use of glue to couple the cap 102 to the substrate 88. The cap 102 forms one chamber around each of the two die 98, 100 protecting the dice 98, 102 from an outside environment, external stresses or both. Utilizing a non-conductive coupling element 96 that has been formed, hardened, and cured in the substrate 88 to attach a cap 102 allows for the manufacturer to avoid the use of glue and avoid any possible glue overflow onto the electric connections and components exposed on the substrate 88 or the dice 98, 100. Additionally, utilizing a non-conductive coupling element 96 that has been formed and cured in the substrate 88 to attach a cap 102 allows for any number of semiconductor dice 98, 100 to be quickly and easily packaged together to manufacture packages to protect a single die, multiple dice, a single electronic device, and multiple electronic devices from an outside environment or external stresses.

The cap 102 and the coupling element 96 are made of materials that can be bonded by techniques that do not require glue to form a tight, unity bonded member. For example, both can be made of a polymer that can be ultrasonically welded to each other. After being placed together, the joint of the cap 102 and the coupling element 96 is subject to an ultrasonic welding beam that permanently fuses the two members to each other. Other techniques can be used, such as heating the joint to melt the two members together, then rapidly cooling it to form a permanent bond, laser welding, or other technique known for attaching two members to each other without glue. A wide variety of plastics, other materials and different polymers that can be ultrasonically welded to each other to form a hermetically sealed, tight permanent bond are well known in the art, and any of these could be used for cap 102 and coupling member 96.

Figure 20:
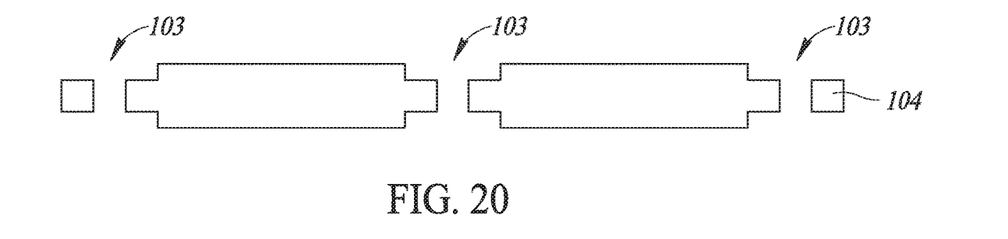
FIG. 20-21 are cross-sectional views of an alternative embodiment of a package at successive steps of a package fabrication process according to the embodiments disclosed.

FIG. 20 is a cross-sectional view of an alternative embodiment of a package including a substrate 104 base layer with a plurality of I-shaped holes 103.

Figure 21:
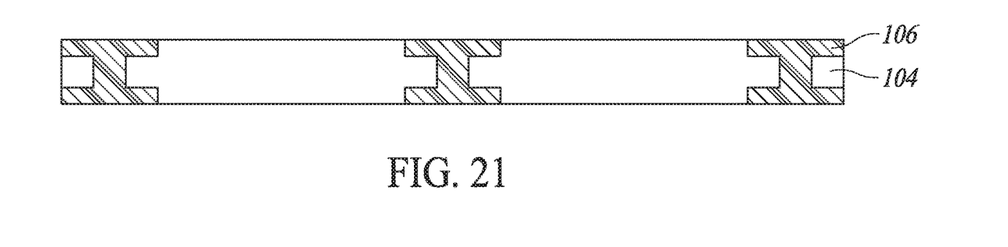

FIG. 21 is a cross-sectional side view of an alternative embodiment of a package including a substrate 104 base layer with a plurality of I-shaped holes 103 filled with a non-conductive coupling element 106. The plurality of I-shaped holes 103 consisting of a plurality of first trenches, a plurality of second trenches, a plurality of third trenches, a plurality of fourth trenches, and a plurality of through holes In this embodiment, a plurality of through holes and pluralities of trenches have been formed in the first surface of the substrate 104. However, pluralities of trenches have been formed on the second surface of the substrate 104. A plurality of third trenches has been formed on the second surface of the substrate 104 opposite to respective first trenches of the plurality of first trenches on the first surface of the substrate 104. Likewise, a plurality of forth trenches has been formed on the second surface of the substrate 104 opposite to respective second trenches of the plurality of second trenches on the first surface of the substrate 104. These plurality of first, second, third, and forth trenches are utilized to further integrate the non-conductive coupling element 106 in the substrate 104 and to form a stronger locking mechanism. The plurality of first trenches and the plurality of third trenches are aligned with through holes of the plurality of through holes. The second trenches of the plurality of second trenches and the fourth trenches of the plurality of fourth trenches may overlap at least one of the through holes aligning the first trenches and the third trenches. This is because the plurality of first, second, third, and forth trenches and the plurality of through holes form a plurality of contiguous I-shaped holes 103. These I-shaped holes 103 allow for the non-conductive coupling element 106 to harden and cure on the second surface of the substrate 104 creating a stronger and more integrated locking mechanism than the T-shaped holes 97 discussed in alternative embodiments above.

Figure 22:
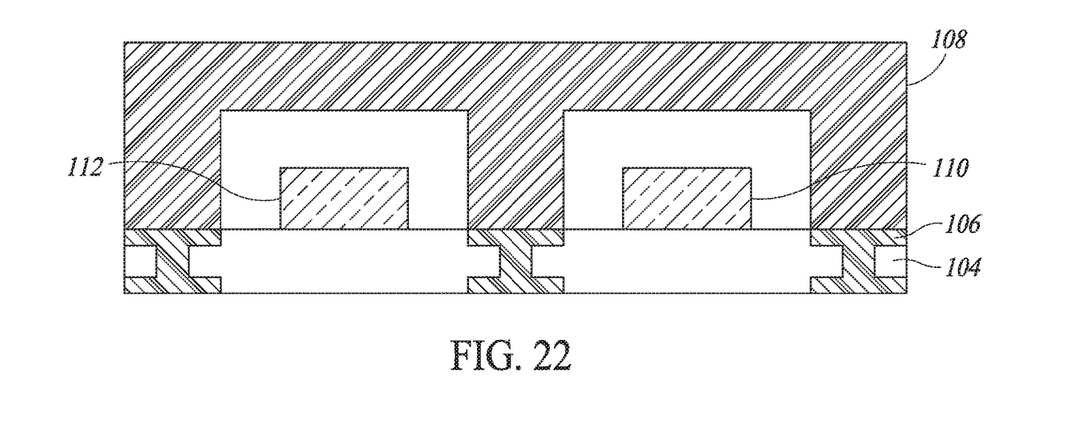
FIG. 22 is a cross-sectional view of a completed package according to the embodiment of FIGS. 20-21.

FIG. 22 is a cross-sectional side view of an alternative embodiment of a completed package 91 including a cap 108 coupled to a non-conductive coupling element 106 formed in a plurality of I-shaped holes 103 in the substrate 104.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a substrate including an insulating material having a first surface and a second surface opposite the first surface;
   a first trench extending into the first surface of the substrate;
   a second trench extending into the second surface of the substrate;
   a first number of a plurality of holes extending from the first trench to the second trench; and
   a non-conductive material being positioned within the first trench, the second trench, and the plurality of holes.

2. The device of claim 1, wherein the non-conductive material is a plastic material.

3. The device of claim 1, wherein a cross-section of the non-conductive material in the first trench, the second trench, and one hole of the first number of holes has an I-shape cross-section.

4. The device of claim 1, further comprising a first die coupled to the first surface of the substrate.

5. The device of claim 4, further comprising a second die coupled to the first surface of the substrate.

6. The device of claim 4, further comprising:
a third trench extending into the first surface of the substrate and being substantially parallel to the first trench and the second trench;
a fourth trench extending into the second surface of the substrate, being aligned with the third trench, and being substantially parallel to the first trench and the second trench;
a second number of holes of the plurality of holes extending from the third trench to the fourth trench; and
wherein the non-conductive material being positioned within the third trench, the fourth trench, and the second number of holes of the plurality of holes.

7. The device of claim 6, further comprising a first support region of the first surface of the substrate positioned between the first trench and the third trench, the first die being on the first support region.

8. The device of claim 7, further comprising a cap coupled to the non-conductive material in the first trench and the third trench.

9. The device of claim 7, further comprising:
a fifth trench extending into the first surface of the substrate and being substantially parallel to the first trench and the second trench;
a sixth trench extending into the second surface of the substrate, being aligned with the fifth trench, and being substantially parallel to the first trench and the second trench;
a third number of holes of the plurality of holes extending from the fifth trench to the sixth trench; and
wherein the non-conductive material being positioned within the fifth trench, the sixth trench, and the third number of holes of the plurality of though holes.

10. The device of claim 9, further comprising:
a second support region of the substrate extending between the third trench and the fifth trench; and
a second die being on the second support region.

11. The device of claim 10, further comprising a cap coupled to the non-conductive material in the first trench, in the third trench, and in the fifth trench.

12. A device, comprising:
a substrate including a non-conductive material having a first surface and a second surface opposite the first surface;
a plurality of non-conductive coupling elements in the substrate, the plurality of non-conductive coupling elements including:
a first portion in a first recess in the first surface of the substrate; and
a plurality of second portions in a plurality of holes that extend from the first recess towards the second surface;
a cap coupled to the plurality of non-conductive coupling elements.

13. The device of claim 12, wherein the non-conductive coupling elements further comprise a third portion in a second recess in the second surface of the substrate, the second recess being aligned with the first recess in the first surface of the substrate.

14. The device of claim 12, wherein the cap further comprises at least three walls, each wall coupled to at least one of the first portions of the plurality of non-conductive coupling elements.

15. The device of claim 14, further comprising:
a first die positioned between a first wall of the at least three walls and a second wall of the at least three walls; and
a second die positioned between the second wall of the at least three walls and a third wall of the at least three walls, the second wall being between the first wall and the third wall.

16. The device of claim 12, further comprising a first die and a second die on the first surface of the substrate, the first die and the second die being covered by the cap.

17. A method, comprising:
forming a plurality of holes in a substrate including a first surface, a second surface opposite the first surface, and a first non-conductive material, the plurality of holes extending between the first surface and the second surface;
forming a recess extending into the first surface of the substrate and being aligned with the plurality of holes; and
forming a second non-conductive material in the recess extending into the first surface of the substrate and the plurality of holes.

18. The method of claim 17, further comprising:
forming a recess extending into the second surface of the substrate and being aligned with the plurality of holes and the recess extending into the first surface of the substrate; and
forming the second non-conductive material in the recess extending into the second surface of the substrate.

19. The method of claim 17, further comprising coupling a cap to a portion of the second non-conductive material in the recess extending into the first surface of the substrate.

20. The method of claim 19, wherein coupling the cap to the portion of the second non-conductive material in the recess extending into the first surface of the substrate includes laser welding the cap to the portion of the second non-conductive material in the recess extending into the first surface of the substrate.

* * * * *

UNITED STATES PATENT AND TRADEMARK OFFICE
CERTIFICATE OF CORRECTION

PATENT NO. : 11,430,765 B2  
APPLICATION NO. : 16/795099  
DATED : August 30, 2022  
INVENTOR(S) : Jian Zhou

Page 1 of 1

It is certified that error appears in the above-identified patent and that said Letters Patent is hereby corrected as shown below:

In the Claims

Column 11, Claim 9, Line 33:
"plurality of though holes." should read: --plurality of holes.--.

Signed and Sealed this
Thirty-first Day of January, 2023

Katherine Kelly Vidal
*Director of the United States Patent and Trademark Office*